US011201146B2

(12) United States Patent
Lee et al.

(10) Patent No.: US 11,201,146 B2
(45) Date of Patent: Dec. 14, 2021

(54) SEMICONDUCTOR DEVICE STRUCTURES

(71) Applicant: Vanguard International Semiconductor Corporation, Hsinchu (TW)

(72) Inventors: Jian-Hsing Lee, Puzih (TW); Yeh-Jen Huang, Hsinchu (TW); Wen-Hsin Lin, Jhubei (TW); Chun-Jung Chiu, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 120 days.

(21) Appl. No.: 16/661,024

(22) Filed: Oct. 23, 2019

(65) Prior Publication Data

US 2021/0125979 A1   Apr. 29, 2021

(51) Int. Cl.
*H01L 27/02* (2006.01)
*H01L 23/552* (2006.01)

(52) U.S. Cl.
CPC ........ *H01L 27/0262* (2013.01); *H01L 23/552* (2013.01)

(58) Field of Classification Search
CPC ............. H01L 27/0262; H01L 27/0277; H01L 27/0259; H01L 2924/13034
See application file for complete search history.

(56) References Cited

U.S. PATENT DOCUMENTS

| | | | |
|---|---|---|---|
| 2005/0212051 A1* | 9/2005 | Jozwiak | H01L 23/62 257/355 |
| 2007/0246740 A1* | 10/2007 | Yu | H01L 29/0692 257/173 |
| 2008/0023766 A1 | 1/2008 | Hung et al. | |

(Continued)

FOREIGN PATENT DOCUMENTS

| | | | |
|---|---|---|---|
| CN | 109037203 A | * | 12/2018 |
| CN | 109994466 A | * | 7/2019 |

(Continued)

OTHER PUBLICATIONS

"Bipolar transistor, BJT" in Semiconductor Glossary by Jerzy Ruzyllo. Accessed online Apr. 12, 2021. (Year: 2016).*

(Continued)

*Primary Examiner* — Shih Tsun A Chou
*Assistant Examiner* — Peter M Albrecht
(74) *Attorney, Agent, or Firm* — Birch, Stewart, Kolasch & Birch, LLP

(57) ABSTRACT

A semiconductor device structure is provided. The semiconductor device structure includes a semiconductor substrate and a first well region that has first conductive type therein. The semiconductor device structure also includes a first doped region embedded in the first well region, and having a second conductive type that is different from the first conductive type. The semiconductor device structure further includes a second well region that has the second conductive type. In addition, the semiconductor device structure includes a first metal electrode disposed on the first doped (Continued)

region of the semiconductor substrate and a second metal electrode disposed on the second well region of the semiconductor substrate.

19 Claims, 7 Drawing Sheets

(56) References Cited

U.S. PATENT DOCUMENTS

| | | | | |
|---|---|---|---|---|
| 2013/0181211 A1* | 7/2013 | Chen | ................ | H01L 29/87 |
| | | | | 257/43 |
| 2018/0211878 A1* | 7/2018 | Ohori | ................ | H01L 27/095 |
| 2018/0308836 A1* | 10/2018 | Wu | ................ | H01L 29/87 |
| 2018/0358352 A1* | 12/2018 | Voldman | ............ | H01L 29/4983 |

FOREIGN PATENT DOCUMENTS

| | | |
|---|---|---|
| TW | 475249 B | 2/2002 |
| TW | 201011912 A | 3/2010 |
| TW | 201839951 A | 11/2018 |
| TW | 201839988 A | 11/2018 |

OTHER PUBLICATIONS

Taiwanese Office Action and Search Report for Taiwanese Application No. 108124400, dated Apr. 7, 2020.

* cited by examiner

SEMICONDUCTOR DEVICE STRUCTURES

BACKGROUND

Technical Field

The disclosure relates to a semiconductor device structure, and more particularly to a semiconductor device structure having an electrostatic protected circuit.

Description of the Related Art

In conventional Integrated Circuits (ICs), semiconductor devices may be easily damaged by high-voltage electrostatic discharge (ESD), mainly because transistors' gate oxide layer structure is closer to drain terminals, and further away from the source/body diffusion region. As a result, when ESD current flows in from drain terminals, its energy tends to disperse over the gate dielectric layer, instead of flowing to a source or drain body doped region, resulting in the gate dielectric layer being permanently zapped.

In a conventional semiconductor device, an additional electrostatic protected device is often used to prevent the transistor device from being zapped. However, installing an additional ESD protected device increases the overall space taken up by the IC, and adds complexity to the process, resulting in a high fabrication cost. Consequently, an improved semiconductor device structure having excellent ESD protected capability is needed.

SUMMARY

Embodiments of the disclosure provide a semiconductor device structure. The semiconductor device structure described above includes a semiconductor substrate and a first well region disposed in the semiconductor substrate, and the first well region has a first conductive type. The semiconductor device structure described above also includes a gate structure, which is disposed on the first well region of the semiconductor substrate. The semiconductor device structure described above further includes a first doped region, which is embedded into the first well region, having a second conductive type that is different from the first conductive type. Additionally, the semiconductor device structure described above includes a second well region, which has the second conductive type. The second well region and the first doped region are situated on two opposite sides of the gate structure. The semiconductor device structure described above also includes a plurality of first metal electrodes, which are disposed on the first doped region of the semiconductor substrate. The semiconductor device structure described above further includes a plurality of second metal electrodes, wherein a portion of the second metal electrodes is disposed on the second well region of the semiconductor substrate.

Some embodiments of the disclosure provide a semiconductor device structure. The semiconductor device structure described above includes a semiconductor substrate and a first well region disposed in the semiconductor substrate and having a first conductive type. The semiconductor device structure described above also includes a gate structure, which is disposed on the first well region of the semiconductor substrate. The semiconductor device structure described above further includes a first doped region and a second doped region having a second conductive type. The first doped region is embedded into the first well region, and the second doped region and the first doped region are situated on two opposite sides of the gate structure. Additionally, the semiconductor device structure described above includes a second well region having the second conductive type; the second well region and the first doped region are situated on two opposite sides of the gate structure. The semiconductor device structure described above also includes a first metal electrode disposed on the first doped region of the semiconductor substrate. The semiconductor device structure described above further includes a second metal electrode disposed on the second well region of the semiconductor substrate. The first doped region, the first well region, and the second doped region constitute a first bipolar junction; the first well region and the second well region constitute a part of a second bipolar junction, and the second metal electrode is electrically connected to the second bipolar junction.

Some embodiments of the disclosure provide a semiconductor device structure. The semiconductor device structure described above includes a semiconductor substrate. The semiconductor device structure described above also includes a first, a second, a third, and a fourth gate structure on the semiconductor substrate. The semiconductor device structure described above further includes a first metal electrode disposed between the first and the second gate structure. Schottky contact is formed between the first metal electrode and the semiconductor substrate. Additionally, the semiconductor device structure described above includes a second metal electrode disposed between the third and the fourth gate structure. Ohmic contact is formed between the second metal electrode and the semiconductor substrate. The first metal electrode and the second metal electrode are electrically connected to a high-voltage terminal.

To more clearly understand the feature and advantage of the disclosure, some embodiments of the disclosure will be described in details with accompanying drawings.

DETAILED DESCRIPTION

Figure 1:
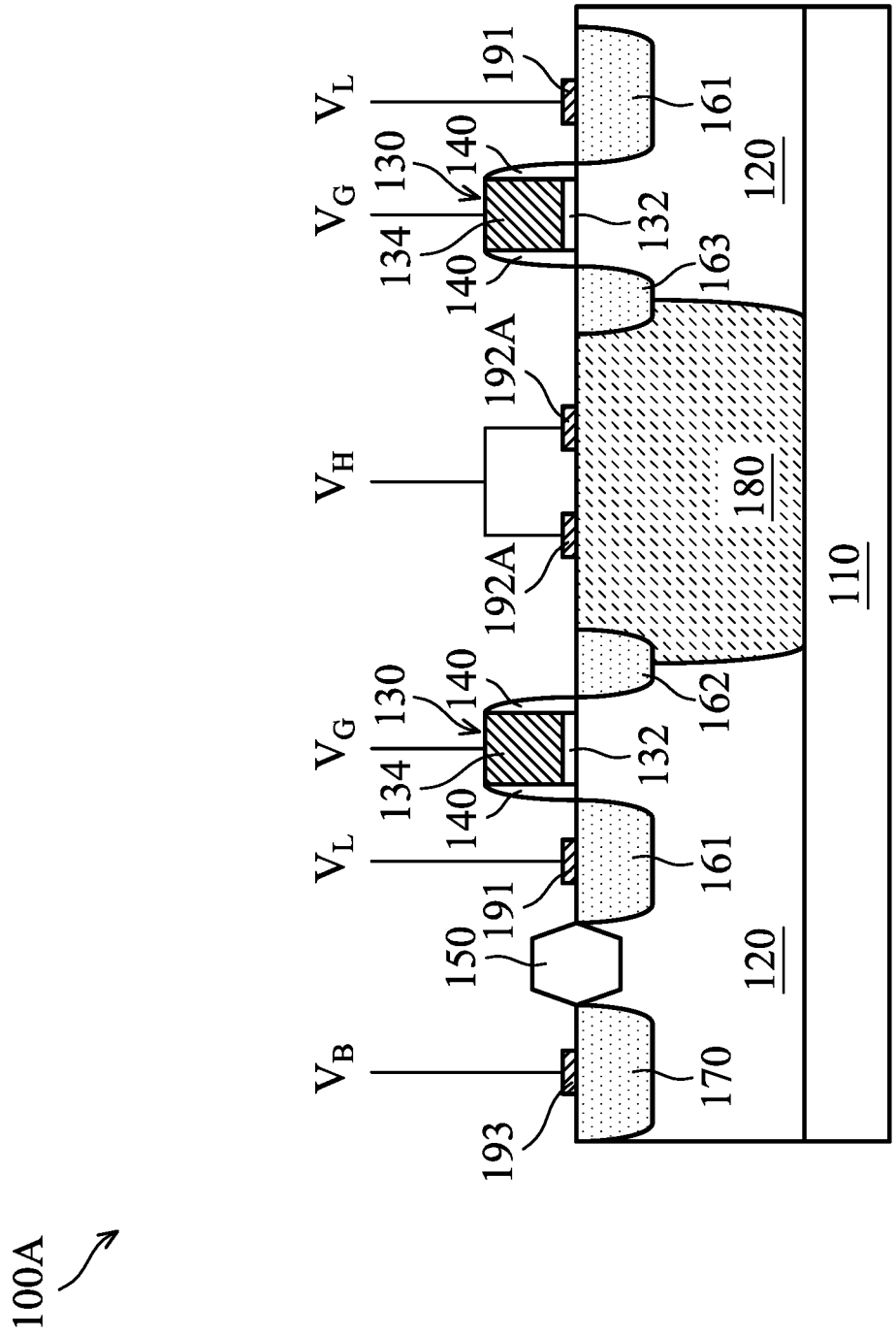
FIG. 1 is a cross-sectional view of a semiconductor device structure according to some embodiments of the disclosure.

The following disclosure provides many different embodiments or examples, for implementing different features of the provided semiconductor device. The specific example of each feature and its position is described as followed, to simplify the specification of the embodiment of the disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the disclosure may repeat reference numerals and/or letters in various embodiments. This repetition is for the purpose of simplicity and clarity, and does not in itself dictate a relationship between the various embodiments discussed.

Some variations of the embodiment are discussed. Throughout various views and illustrative embodiments, like reference numbers are used to designate like elements. It is understandable that the semiconductor device structure may include additional features, and some described features may be replaced or removed for other embodiments of the structure.

Embodiments of the disclosure disclose the embodiment of the semiconductor device structure, and the embodiments described above may be included in an Integrated Circuit (IC), such as microprocessors, memory cells and/or other devices. The IC described above can also include various passive and active microelectronic devices, such as thin-film resistors, other types of capacitors, such as metal-insulator-metal capacitors (MIMCAP), inductors, diodes, metal-oxide semiconductor field-effect transistors (MOSFETs), complementary metal-oxide semiconductor (CMOS) transistors, bipolar junction transistors (BJTs), lateral-diffused MOS transistors, high power MOS transistors, or the like. Those skilled in the art may understand, and may use the semiconductor device in IC's with other types of semiconductor devices.

FIG. 1 is a cross-sectional view of a semiconductor device structure 100A according to some embodiments of the disclosure. As shown in FIG. 1, the semiconductor device structure 100A includes a semiconductor substrate 110. The semiconductor substrate 110 may be a bulk semiconductor or a semiconductor-on-insulation (SOI) substrate. The semiconductor substrate 110 may be a wafer, such as a silicon wafer. In general, the SOI substrate includes a layer of semiconductor material formed above an insulation layer. The insulation layer may be, for example, a buried oxide (BOX) layer, a silicon oxide layer, or the like, which provides an insulation layer on a silicon or glass substrate. In other substrates, for example, a multiple layer substrate or a gradient substrate may be used.

In some embodiments, the semiconductor substrate 110 may be a semiconductor material, which may include Si or Ge. The semiconductor substrate 110 may also be a compound semiconductor that includes SiC, GaAs, GaP, InP, InAs, and/or InSb. The semiconductor substrate 110 may also be an alloy semiconductor that includes SiGe, GaAsP, AlInAs, AlGaAs, GaInAs, GaInP, and/or GaInAsP, or a combination thereof. In some embodiments, the semiconductor substrate 110 has a first conductive type, such as p-type.

Furthermore, the semiconductor device structure 100A may include an epitaxial layer (not shown), which may be formed above the semiconductor substrate 110. The epitaxial layer described above may include Si, Ge, Si and Ge, III-V compounds, or a combination thereof. The epitaxial layer described above may be formed by epitaxial growth, such as metal-organic chemical vapor deposition (MOCVD), metal-organic vapor phase epitaxy (MOVPE), plasma-enhanced chemical vapor deposition (PECVD), remote plasma chemical vapor deposition (RPCVD), molecular beam epitaxy (MBE), hydride vapor phase epitaxy (HVPE), liquid phase epitaxy (LPE), chloride vapor phase epitaxy (Cl-VPE), or the like. In some embodiments, the epitaxial layer described above may have a first conductive type, such as p-type.

The semiconductor device structure 110A includes a well region 120, which is formed in the semiconductor substrate 110. Alternatively, the well region 120 may be formed in the epitaxial layer described above. In some embodiments, the well region 120 has a first conductive type, such as p-type. In some embodiments, the doping concentration of the well region 120 may be in the range between about $10^{12}$ atoms/$cm^3$ and about $10^{17}$ atoms/$cm^3$.

The semiconductor device structure 100A includes a plurality of gate structures 130. A gate structure 130 is disposed on the well region 120 of the semiconductor substrate 110. The gate structure 130 includes a gate dielectric layer 132 and a gate electrode 134. The gate dielectric layer 132 may be SiO, SiN, SiNO, high-k dielectric materials, or any other suitable dielectric materials, or a combination thereof. Such a high-k dielectric material may be metal oxide, metal nitride, metal silicide, transition metal oxide, transition metal nitride, transition metal silicide, metal oxynitride, metal aluminate, zirconium silicate, zirconium aluminate. For example, the high-k dielectric material may be LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba, Sr)$TiO_3$ (BST), $Al_2O_3$, other suitable dielectric materials, or a combination thereof.

The gate dielectric layer 132 may be formed by chemical vapor deposition (CVD) or spin coating. The CVD may be, for example, low pressure chemical vapor deposition (LPCVD), low temperature chemical vapor deposition (LTCVD), rapid thermal chemical vapor deposition (RT-CVD), plasma enhanced chemical vapor deposition (PECVD), atomic layer deposition (ALD), or other usual methods.

The gate electrode 134 is disposed on the gate dielectric 132. In some embodiments, the gate electrode 134 may be polysilicon. In some embodiments, the gate electrode 134 may be one or more types of metal, metal nitride, conductive metal oxide, or a combination thereof. The metal described above includes Mo, W, Ti, Ta, Pt, or Hf. The metal nitride described above may include molybdenum nitride, tungsten nitride, titanium nitride, and tantalum nitride. The conductive metal oxide described above may include ruthenium oxide and indium tin oxide. The gate electrode 134 may be formed by CVD, sputter, resistor heating evaporation, electrical beam evaporation, or other suitable deposition methods.

The semiconductor device structure 100A includes a gate spacer 140. The gate spacer 140 is disposed on two opposite sides of the gate structure 130, and covers the gate dielectric 132 and side surface of the gate electrode 134. The gate spacer 140 may be a multiple layer structure or a single layer structure. The material of the gate spacer 140 is, for example, nitride, oxide, or another suitable material.

The semiconductor device structure 100A includes an isolation region 150. In some embodiments, the isolation region 150 may be shallow trench isolation (STI). The semiconductor substrate 110 may be patterned by lithography process and etching process, to form multiple openings, followed by filling the openings with dielectric material by deposition process to form the isolation region 150. In other embodiments, the isolation region 150 may be field oxide region formed by silicon oxidation. The lithography process described above includes photo resist coating (for example, self-spinning coating), soft bake, mask alignment, exposure, post-exposure bake, photo-resist development, rinse, drying (for example, hard bake), and other suitable processes, or a combination thereof. Lithography process may also be replaced by mask-free lithography, electrical beam writing, ion beam writing, or molecular imprint. The etching process described above includes dry etching, wet etching, or other etching method (for example, reactive ion etching). The etching process may also be pure chemistry etching (plasma etching), pure physical etching (ion milling), or the combination thereof. The deposition process described above includes CVD, physical vapor deposition (PVD), ALD, or other deposition methods.

In some embodiments, the semiconductor device structure 100A includes a doped region 161, a doped region 162, and a doped region 163, which have a second conductive type that is different from the first conductive type, such as n-type. The doping concentration of the doped region 161, the doped region 162, and the doped region 163 is in the range between about $10^{19}$ atoms/cm$^3$ and about $10^{21}$ atoms/cm$^3$. The doped region 161 is embedded in the well region 120, and is disposed between the isolation region 150 and the gate structure 130; the doped region 162 and the doped region 161 are situated on two opposite sides of the gate structure 130; the doped region 163 and the doped region 161 are situated on two opposite sides of the gate structure 130, and the doped region 161 and the doped region 163 are separated by the well region 180. As shown in FIG. 1, the doped region 162 is in contact with the well region 120 and the well region 180; the doped region 163 is in contact with the well region 120 and the well region 180.

The semiconductor device structure 100A includes a doped region 170 that is embedded in the well region 120, which has a first conductive type, such as p-type. The concentration of the doped region 170 is in the range between about $10^{19}$ atoms/cm$^3$ and about $10^{21}$ atoms/cm$^3$. The aforementioned doped regions 161, 162, 163, and/or doped region 170 may be formed using methods such as ion implantation or diffusion, and the implanted dopant may be activated by rapid thermal annealing (RTA) process.

In some embodiments, the semiconductor device structure 100A includes a well region 180. The well region 180 has a second conductive type, such as n-type. In some embodiments, doping concentration of the well region 180 is in the range between about $10^{12}$ atoms/cm$^3$ and about $10^{19}$ atoms/cm$^3$. The well region 180 is surrounded by the well region 120, and separates the doped region 162 and the doped region 163. In some embodiments, the well region 180 is in contact with the well region 120 and the doped region 162; the well region 180 is in contact with the well region 120 and the doped region 163. In some embodiments, doping concentration of the well region 180 is smaller than doping concentration of the doped regions 161, 162, and 163. In some embodiments, doping depth of the well region 180 is greater than doping depth of the doped regions 162 and 163.

The semiconductor device structure 100A includes a metal electrode 191, a metal electrode 192A, and a metal electrode 193. The materials of the metal electrode 191, the metal electrode 192A, and the metal electrode 193 may include Cu, Ti, Co, W, Ni, or another suitable metal material, and may be formed by using a PVD process (for example, sputter process), a CVD process, a spin coating process, another suitable process, or a combination thereof.

In addition, the semiconductor device structure 100A may include a silicide layer (not shown), which is disposed between the semiconductor substrate 110 and the metal electrode 191, the metal electrode 192A, and/or the metal electrode 193. In some embodiments, annealing process may be performed after depositing metal material over the semiconductor substrate 110. Next, metal material is reacted with the surface of the semiconductor substrate 110 to form the silicide layer over the surface of the semiconductor substrate 110. After the formation of silicide, the remaining portion of the metal material that has not reacted with the semiconductor substrate 110 is removed. The remaining unreacted portion of the metal material may be removed in an etching process, such as a wet etching process, a dry etching process, one or more other suitable processes, or a combination thereof. Additionally, the semiconductor device structure 100A may also include a barrier layer (not shown). The barrier layer is disposed between the semiconductor substrate 110 and the metal electrode 191, the metal electrode 192A, and/or the metal electrode 193. The barrier layer may include Ti, TiN, Ta, TaN, or another suitable material.

In some embodiments, the metal electrode 191 is disposed on the doped region 161; the metal electrode 192A is disposed on the well region 180; the metal electrode 193 is disposed on the doped region 170. The metal electrodes 191, 192A, and 193 are electrically connected to output voltage $V_L$, $V_H$, and $V_B$, respectively; the gate structure 130 is electrically connected to output voltage $V_G$. In some embodiments, $V_L$ is a low-voltage terminal, and $V_H$ is a high-voltage terminal. It should be noted that the semiconductor device structure 100A illustrated in FIG. 1 includes two metal electrodes 192A. In other embodiments, there can be one or more metal electrodes 192A. The doped region 161 may serve as a source doped region of the semiconductor device structure 100A, and the doped region 163 may serve as a drain doped region of the semiconductor device structure 100A.

In some embodiments, Schottky contact is formed between the metal electrode 192A and the well region 180, thereby forming a Schottky diode. Ohmic contact is formed between the metal electrode 191 and the doped region 161. Ohmic contact is formed between the metal electrode 193 and the doped region 170. As shown in FIG. 1, the doped region 161, the well region 120, and the doped region 162 constitute a bipolar junction, such as a NPN junction. In some embodiments, the well region 120 and the well region 180 constitute a part of a bipolar junction, such as a PNP junction, and the metal electrode 192A is electrically connected to the bipolar (PNP) junction.

In some embodiments, the metal electrode 192A that is electrically connected to the high-voltage terminal is in contact with the well region 180 having lower doping concentration, to form Schottky junction, in order to generate an additional bipolar junction. Therefore, the semiconductor device structure 100A integrates NPN junction and PNP junction to form a CMOS. The PNP junction and the NPN junction, described above, form a positive feedback circuit, to elevate the capability of the semiconductor device structure 100A as an electrostatic discharge (ESD) protected device.

Figure 2:
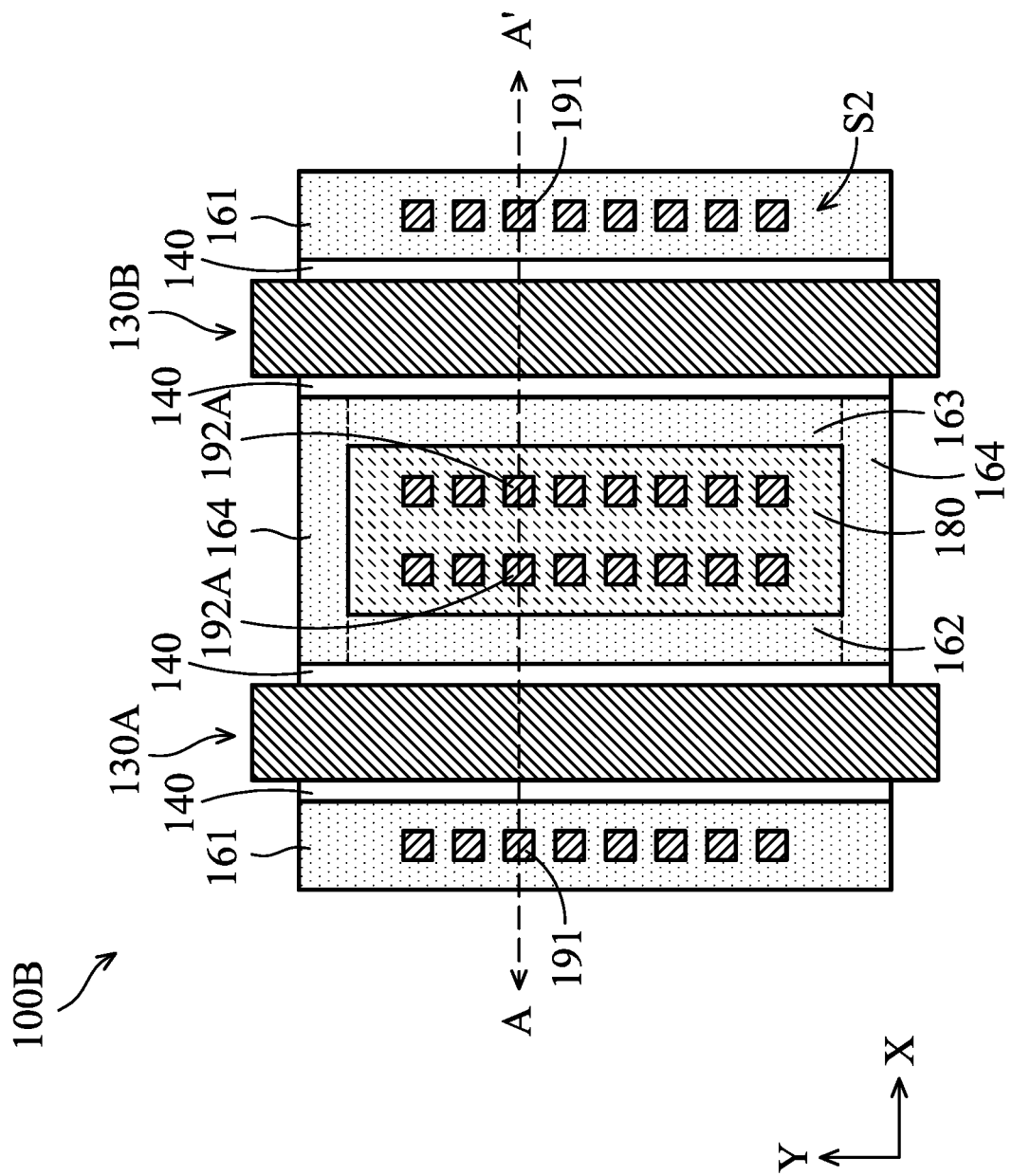
FIG. 2 is a top view layout of a semiconductor device structure according to some embodiments of the disclosure.
Figure 3:
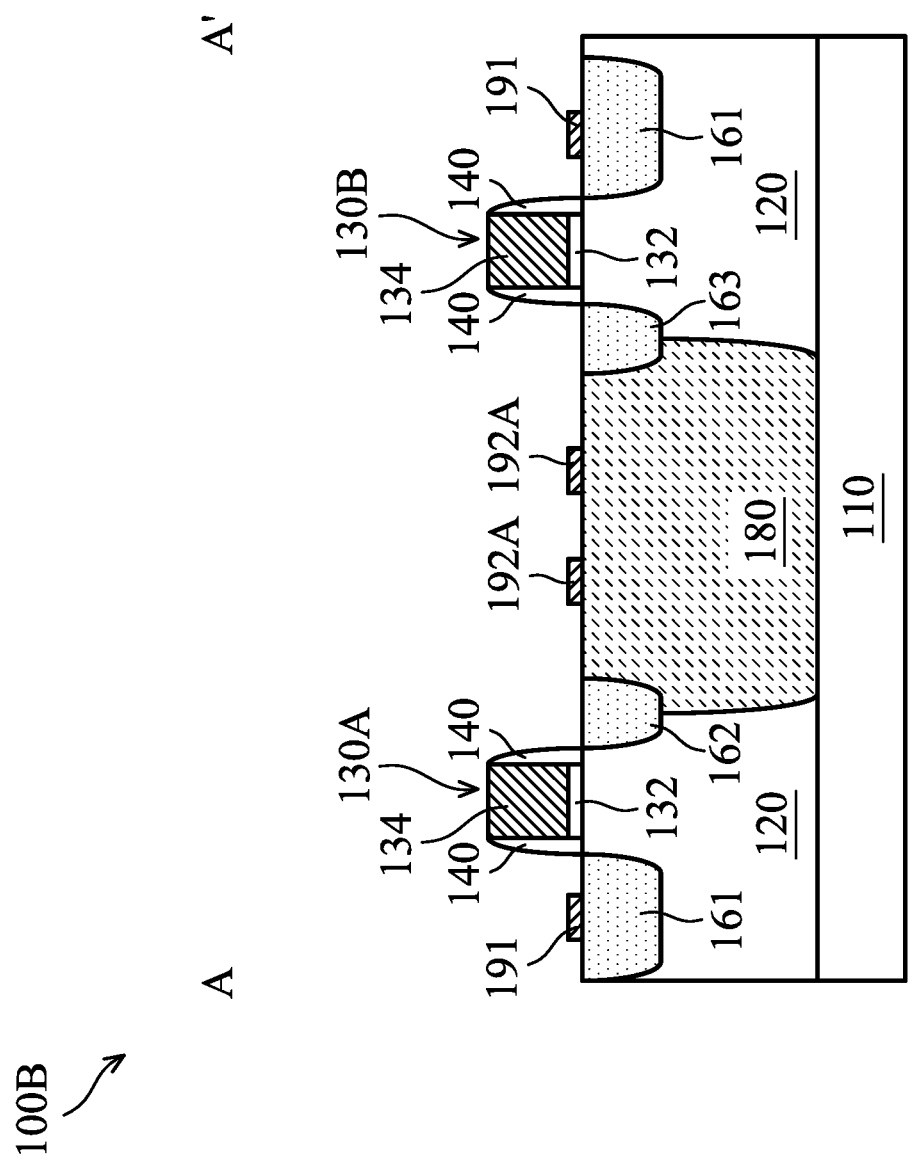
FIG. 3 is a cross-sectional view along line A-A' of the semiconductor device structure shown in FIG. 2.

Refer to FIGS. 2 and 3. FIG. 2 is a top view layout of a semiconductor device structure 100B according to some embodiments of the disclosure, and FIG. 3 is a cross-sectional view along line A-A' of the semiconductor device structure 100B shown in FIG. 2. Some features are omitted in order to clearly illustrate the layout of metal electrodes, doped regions, and gate structures.

As shown in FIGS. 2 and 3, the semiconductor device structure 100B includes a gate structure 130A and a gate structure 130B. The materials of the gate structure 130A and the gate structure 130B can be the same as, or similar to, the gate structure 130, and the details are not described again herein to avoid repetition. The gate structure 130A and the gate structure 130B may extend along Y-axis direction. A plurality of the metal electrodes 191 are arranged along Y-direction, and are disposed on the doped region 161. Two columns of the metal electrodes 192A are disposed between the gate structure 130A and the gate structure 130B, and are disposed on the well region 180. The plurality of the metal electrodes 192A in each column are arranged along Y-direction.

It should be noted that FIG. 2 illustrates two columns of the metal electrodes 192A; in other embodiments, however, the semiconductor device structure 100B may include more columns of the metal electrodes 192A. In addition, the semiconductor device structure 100B includes a plurality of isolation regions (not shown), which are disposed on Y-axis between two adjacent metal electrodes 191, and on Y-axis between two adjacent metal electrodes 192A.

The semiconductor device structure 100B includes a doped region 164 that is connected to the doped region 162 and the doped region 163. In this embodiment, the doped region 162 and the doped region 163 are located on two opposite sides of the well region 180. In some embodiments, the doped regions 161, 162, 163, and 164 may be formed by a single step and have similar doping concentration and the same conductive type, such as n-type. In some embodiments, the well region 180 is surrounded by the doped regions 162, 163, and 164.

As shown in FIG. 3, Schottky contact is formed between the metal electrode 192A and the well region 180, thereby forming a Schottky diode. Ohmic contact is formed between the metal electrode 191 and the doped region 161. In some embodiments, the semiconductor device structure 100B includes a first bipolar junction, such as NPN junction, constituted by the doped region 161, the well region 120, and the doped region 162; the semiconductor device structure 100B also includes a part of a second bipolar junction, such as PNP junction, constituted by the well region 120 and the well region 180, and the metal electrode 192A is electrically connected to the second bipolar (PNP) junction. The first and second bipolar junctions described above form a positive feedback circuit, which elevates the capability of the semiconductor device structure 100B as an ESD protected device.

Figure 4:
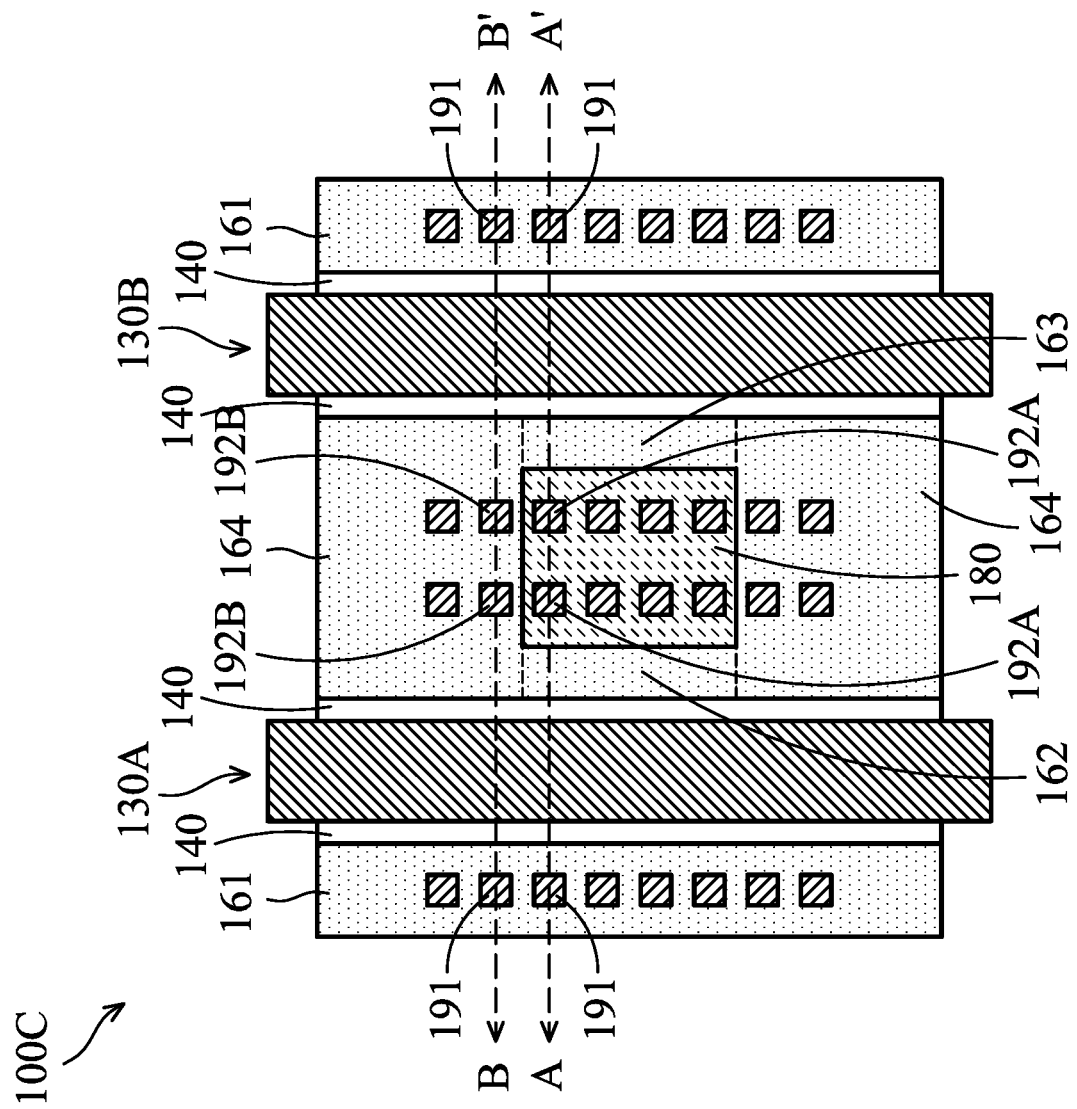
FIG. 4 is a top view layout of a semiconductor device structure according to some embodiments of the disclosure.
Figure 5:
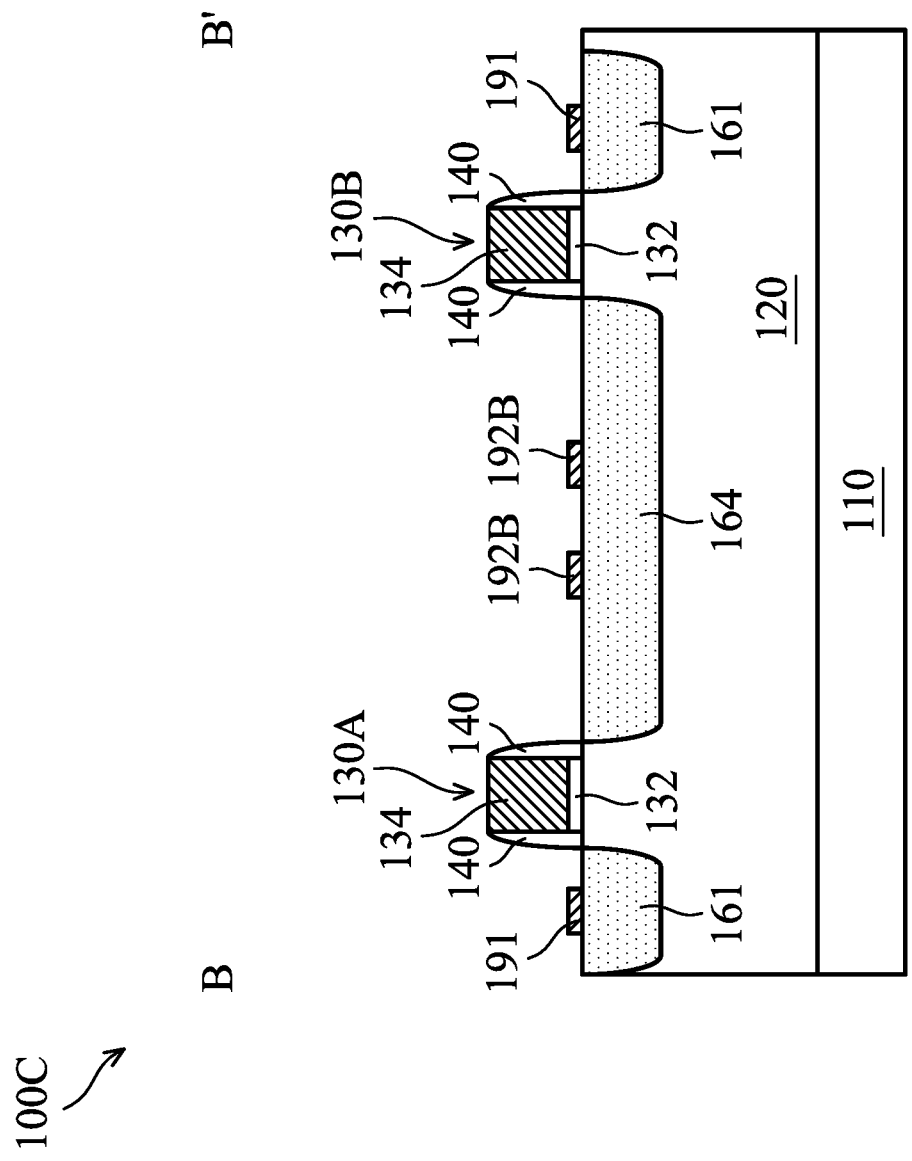
FIG. 5 is a cross-sectional view along line B-B' of the semiconductor device structure shown in FIG. 4.

Refer to FIGS. 4 and 5. FIG. 4 is a top view layout of a semiconductor device structure 100C according to some embodiments of the disclosure, and FIG. 5 is a cross-sectional view along line B-B' of the semiconductor device structure 100C shown in FIG. 4. Some features are omitted in order to clearly illustrate the layout of metal electrodes, doped regions, and gate structures.

In some embodiments, the semiconductor device structure 100C may be the same as, or similar to, the semiconductor device structure 100B; one of the differences being: the semiconductor device structure 100C includes metal electrodes 192B. In this embodiments, the cross-sectional structure along A-A' is different from the cross-sectional structure along B-B' in the semiconductor device structure 100C. The cross-sectional structure along A-A' in the semiconductor device structure 100C may be the same as, or similar to, the structure shown in FIG. 3, the details are not described again herein to avoid repetition.

In some embodiments, as shown in FIG. 4, the metal electrodes 192A and the metal electrodes 192B are disposed between the gate structure 130A and the gate structure 130B. The metal electrodes 192A are disposed on the well region 180, and the metal electrodes 192B are disposed on the doped region 164.

Refer to FIG. 5. Ohmic contact is formed between the metal electrodes 192B and the doped region 164 with higher doping concentration. In some embodiments, the doped region 161, the well region 120, and the doped region 164 constitute a bipolar junction, such as an NPN junction. In this embodiment, Schottky contact is formed between a portion of metal electrodes, such as the metal electrodes 192A, connected to the high-voltage terminal and the well region 180 in the semiconductor device structure 100C. Ohmic contact is formed between another portion of metal electrodes, such as the metal electrodes 192B, and the doped region 164.

In some embodiments, the semiconductor device structure 100C includes a first bipolar junction, constituted by the doped region 161, the well region 120, and the doped region 162, on A-A' cross section, and a part of a second bipolar junction, such as PNP junction, constituted by the well region 120 and the well region 180, and the metal electrodes 192A are electrically connected to the second bipolar (PNP) junction. The first bipolar junction and the second bipolar junction described above form a positive feedback circuit that elevates the capability of the semiconductor device structure 100C as an ESD protected device. A third bipolar junction, such as NPN junction, constituted by the doped region 161, the well region 120, and the doped region 164, is included on B-B' cross section. Schottky contact and additional PNP junctions are not formed on B-B' cross section.

Figure 6:
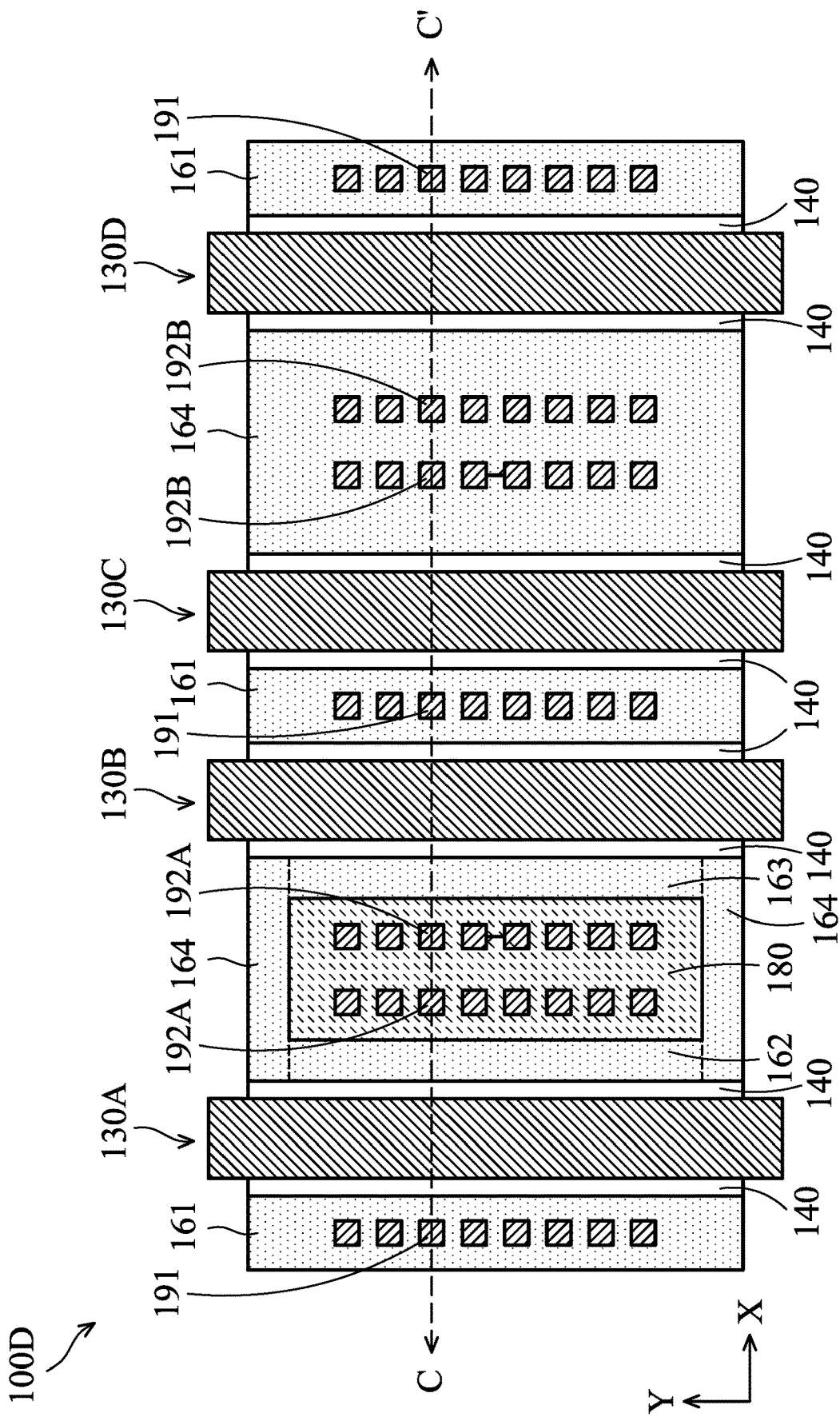
FIG. 6 is a top view layout of a semiconductor device structure according to some embodiments of the disclosure.
Figure 7:
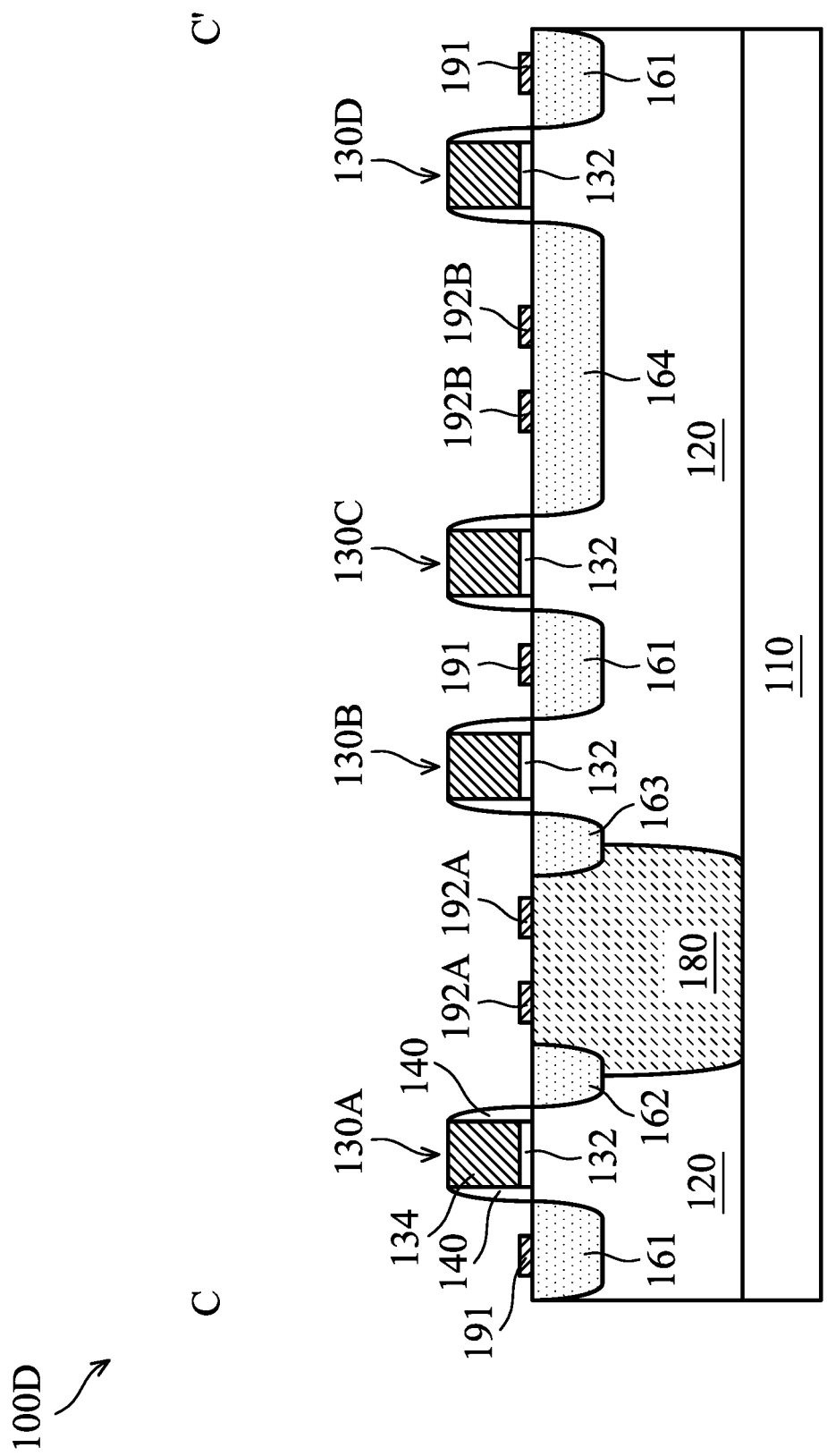
FIG. 7 is a cross-sectional view along line C-C' of the semiconductor device structure shown in FIG. 6.

Refer to FIGS. 6 and 7. FIG. 6 is a top view layout of a semiconductor device structure 100D according to some embodiments of the disclosure, and FIG. 7 is a cross-sectional view along line C-C' of the semiconductor device structure 100D shown in FIG. 6. Some features are omitted in order to clearly illustrate the layout of metal electrodes, doped regions, and gate structures.

In some embodiments, the semiconductor device structure 100D may be the same as, or similar to, the semiconductor device structure 100C; one of the differences being: the metal electrodes 192A and the metal electrodes 192B are disposed between different gate structures. In some embodiments, the semiconductor device structure 100D includes a gate structure 130C and a gate structure 130D, the gate structure 130C and the gate structure 130D may be the same as, or similar to, the gate structure 130, and the details are not described again herein to avoid repetition. As shown in FIG. 6, the gate structures 130A, 130B, 130C, and 130D may be arranged along the X-direction. In some embodiments, a well region 180 is formed between the gate structure 130A and the gate structure 130B, and is not formed between the gate structure 130C and the gate structure 130D.

As shown in FIGS. 6 and 7, the semiconductor device structure 100D includes the metal electrodes 192A and the metal electrodes 192B. The metal electrodes 192A are disposed between the gate structure 130A and the gate structure 130B; the metal electrodes 192B are disposed between the gate structure 130C and the gate structure 130D. The metal electrodes 192A and the metal electrodes 192B are electrically connected to an output voltage $V_H$. In this embodiment, Schottky contact is formed between the metal electrodes 192A and the well region 180; Ohmic contact is formed between the metal electrodes 192B and the doped region 164.

In this embodiment, the metal electrodes 192A and 192B, electrically connected to a high-voltage terminal in the semiconductor device structure 100D, are formed between different gate structures, respectively. Schottky contact and Ohmic contact are formed between the metal electrodes 192A and the semiconductor substrate 110, and between the metal electrodes 192B and the semiconductor substrate 110, respectively. On C-C' cross section, the semiconductor device structure 100D includes a first bipolar junction, such as NPN junction, constituted by the doped region 161, the well region 120, and the doped region 162, and includes a part of a second bipolar junction, such as PNP junction, constituted by the well region 120 and the well region 180, and the metal electrodes 192A are electrically connected to the second bipolar (PNP) junction. The first and the second bipolar junction described above form a positive feedback circuit that elevates the capability of the semiconductor device structure 100D as an ESD protected device. Additionally, the semiconductor device structure 100D further includes a bipolar junction, such as NPN junction, constituted by the doped region 161, the well region 120, and the doped region 164. In this embodiment, by forming the well region 180, Schottky contact and additional PNP junctions are formed between the gate structures 130A and 130B; Schottky contact and additional PNP junctions are not formed between the gate structures 130C and 130D.

Various changes and adjustments may be made in the embodiments of the disclosure. In some embodiments, the layout of a semiconductor device structure may have different variations. In the structure shown in FIG. 6, the layout of doped regions and metal electrodes between the gate structure 130A and the gate structure 130B may be the same as the semiconductor device structure 100C shown in FIG. 4. That is, between the gate structure 130A and the gate structure 130B in the semiconductor device structure 100D, there is a portion of metal electrodes 192A disposed on the well region 180, and Schottky contact is formed between such portion and the semiconductor substrate 110; there is a portion of metal electrodes 192B disposed on the doped region 164, and Ohmic contact is formed between such portion and the semiconductor substrate 110.

In some embodiments of the disclosure, well region, instead of doped region with higher concentration, is disposed in the region that is electrically connected to a high-voltage terminal, so a Schottky diode is formed between the metal electrodes and the well region. The capability of the semiconductor device structure as an ESD protected device can be elevated.

Although the embodiments of the disclosure and its advantages have been disclosed above, it should be understood that any of those skilled in the art may make changes, replacements, and retouches without departing from the spirit and scope of the disclosure. In addition, the scope of the disclosure is not limited to the processes, tools, fabrications, material compositions, devices, methods, and operations in the specific embodiments described in the specification. Persons skilled in the art will understand from the disclosed contents of some embodiments of the disclosure, that the processes, tools, fabrications, material compositions, devices, methods, and operations developed at the present time or in the future, may all be used according to some embodiments of the disclosure, as long as almost the same functions are carried out and almost the same results are achieved in the embodiments introduced herein. Therefore, the scope of the disclosure includes the aforementioned processes, tools, fabrications, material compositions, devices, methods, and operations. Additionally, every claim constitutes an individual embodiment, and the scope of the disclosure also includes the combination of each claim and embodiment.

What is claimed is:

1. A semiconductor device structure, comprising:
    a semiconductor substrate;
    a first well region disposed in the semiconductor substrate and having a first conductive type;
    a gate structure disposed on the first well region of the semiconductor substrate;
    a first doped region embedded in the first well region, and having a second conductive type that is different from the first conductive type;
    a second well region having the second conductive type, wherein the second well region and the first doped region are situated on two opposite sides of the gate structure, wherein the second well region is laterally surrounded by the first well region;
    a plurality of first metal electrodes disposed on the first doped region of the semiconductor substrate; and
    a plurality of second metal electrodes, wherein a portion of the plurality of second metal electrodes is disposed on the second well region of the semiconductor substrate, wherein the portion of the plurality of second metal electrodes is in direct contact with the second well region.

2. The semiconductor device structure of claim 1, wherein Schottky contact is formed between the portion of the plurality of second metal electrodes and the second well region.

3. The semiconductor device structure of claim 1, wherein Ohmic contact is formed between the plurality of first metal electrodes and the first doped region.

4. The semiconductor device structure of claim 1, further comprising:
    a second doped region having the second conductive type, wherein the second doped region and the first doped region are situated on two opposite sides of the gate structure, and the second doped region is in contact with the first well region and the second well region.

5. The semiconductor device structure of claim 4, further comprising:
    a third doped region having the second conductive type, wherein the third doped region and the first doped region are situated on two opposite sides of the gate structure, and the third doped region and the second doped region are separated by the second well region.

6. The semiconductor device structure of claim 4, wherein the first doped region, the first well region, and the second doped region constitute a first bipolar junction; and the first well region and the second well region constitute a part of a second bipolar junction, wherein the portion of the plurality of second metal electrodes is electrically connected to the second bipolar junction.

7. The semiconductor device structure of claim 6, wherein the first bipolar junction is NPN junction, and the second bipolar junction is PNP junction.

8. The semiconductor device structure of claim 1, further comprising:
    a fourth doped region having the second conductive type, wherein the fourth doped region and the first doped region are situated on two opposite sides of the gate structure, and another portion of the plurality of second metal electrodes is disposed on the fourth doped region of the semiconductor substrate.

9. The semiconductor device structure of claim 8, wherein Ohmic contact is formed between the another portion of the plurality of second metal electrodes and the fourth doped region.

10. The semiconductor device structure of claim 1, wherein the plurality of first metal electrodes are electrically connected to a low-voltage terminal, and the plurality of second metal electrodes are electrically connected to a high-voltage terminal.

11. A semiconductor device structure, comprising:
a semiconductor substrate;
a first well region disposed in the semiconductor substrate and having a first conductive type;
a gate structure disposed on the first well region of the semiconductor substrate;
a first doped region embedded in the first well region, and having a second conductive type that is different from the first conductive type;
a second doped region having the second conductive type, wherein the second doped region and the first doped region are situated on two opposite sides of the gate structure;
a second well region having the second conductive type, wherein the second well region is in contact with the first well region and the second doped region, wherein the second well region is laterally surrounded by the first well region;
a first metal electrode disposed on the first doped region of the semiconductor substrate; and
a second metal electrode disposed on the second well region of the semiconductor substrate, wherein the second metal electrode is in direct contact with the second well region;
wherein the first doped region, the first well region, and the second doped region form a first bipolar junction; the first well region and the second well region form a part of a second bipolar junction, wherein the second metal electrode is electrically connected to the second bipolar junction.

12. The semiconductor device structure of claim 11, wherein the first bipolar junction is NPN junction, and the second bipolar junction is PNP junction.

13. The semiconductor device structure of claim 11, further comprising:
a third doped region having the second conductive type, wherein the third doped region and the second doped region are separated by the second well region.

14. The semiconductor device structure of claim 11, wherein Ohmic contact is formed between the first metal electrode and the first doped region, and Schottky contact is formed between the second metal electrode and the second well region.

15. The semiconductor device structure of claim 11, wherein the first metal electrode electrically connects to a low-voltage terminal, and the second metal electrode electrically connects to a high-voltage terminal.

16. A semiconductor device structure, comprising:
a semiconductor substrate;
a first gate structure, a second gate structure, a third gate structure, and a fourth gate structure disposed on the semiconductor substrate;
a first metal electrode disposed between the first gate structure and the second gate structure, wherein Schottky contact is formed between the first metal electrode and the semiconductor substrate; and
a second metal electrode disposed between the third gate structure and the fourth gate structure, wherein Ohmic contact is formed between the second metal electrode and the semiconductor substrate;
wherein the first metal electrode and the second metal electrode are electrically connected to a high-voltage terminal.

17. The semiconductor device structure of claim 16, further comprising:
a third metal electrode disposed between the second gate structure and the third gate structure, wherein Ohmic contact is formed between the third metal electrode and the semiconductor substrate, and the third metal electrode is electrically connected to a low-voltage terminal.

18. The semiconductor device structure of claim 16, further comprising:
a first well region disposed in the semiconductor substrate and having a first conductive type;
a second well region surrounded by the first well region, and having a second conductive type that is different from the first conductive type, and situated between the first gate structure and the second gate structure.

19. The semiconductor device structure of claim 18, wherein the second well region is not disposed between the third gate structure and the fourth gate structure.

* * * * *